(12) United States Patent
Yamauchi

(10) Patent No.: US 7,964,455 B2
(45) Date of Patent: Jun. 21, 2011

(54) MANUFACTURING METHOD OF SEMICONDUCTOR DEVICE

(75) Inventor: Takahiro Yamauchi, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 332 days.

(21) Appl. No.: 12/320,240

(22) Filed: Jan. 22, 2009

(65) Prior Publication Data

US 2009/0221124 A1  Sep. 3, 2009

(30) Foreign Application Priority Data

Feb. 29, 2008  (JP) ................. 2008-049652

(51) Int. Cl.
H01L 21/84 (2006.01)
(52) U.S. Cl. .......... 438/163; 438/306; 438/155
(58) Field of Classification Search .......... 438/163
See application file for complete search history.

(56) References Cited

U.S. PATENT DOCUMENTS 5,658,808 A * 8/1997 Lin .................. 438/155

FOREIGN PATENT DOCUMENTS

| JP | 2002-289845 | 10/2002 |
|---|---|---|
| JP | 2003-197765 | 7/2003 |
| JP | 2005-142475 | 6/2005 |

\* cited by examiner

Primary Examiner — Thanh V Pham
Assistant Examiner — Tony Tran
(74) Attorney, Agent, or Firm — Rabin & Berdo, PC

(57) ABSTRACT

The method includes the steps of forming a gate insulating film over a first conductivity-type layer surface of a semiconductor substrate, implanting a second conductivity-type impurity into the first conductivity-type layer located on both sides adjacent to a conductive layer forming predetermined region, forming a conductive layer over the gate insulating film surface located to cover the first conductivity-type layer surface with no impurity implanted therein and the partial regions surface of the pair of low-concentration diffusion layers adjacent to the first conductivity-type layer, implanting a second conductivity-type impurity into regions uncovered with the conductive layer, of the pair of low-concentration diffusion layers to contact source and drain electrodes, and forming slits to divide regions lying on the sides of the high-concentration diffusion layers, each of which is provided to contact at least the drain electrode of the conductive layer located over the low-concentration diffusion layers, into two respectively.

7 Claims, 2 Drawing Sheets

MANUFACTURING METHOD OF SEMICONDUCTOR DEVICE

CROSS REFERENCE TO RELATED APPLICATION

This application claims the benefit of Japanese Patent Application No. 2008-49652, filed Feb. 29, 2008, which is incorporated by reference.

BACKGROUND OF THE INVENTION

The present invention relates to a method for manufacturing a semiconductor device.

A conventional high breakdown voltage MOS transistor has a structure wherein in order to relax an electric field lying under a gate electrode thereby to suppress the occurrence of hot carriers, low-concentration diffusion layers with an impurity diffused therein in a low concentration overlap beneath the gate electrode.

In order to more reduce the size of the transistor having this type of structure, there has been proposed a technique for forming each of slits in at least a region on the drain electrode side, of a gate electrode (refer to a patent document 1 (Japanese Patent Application Laid-open No. 2005-142475)).

In the present technique, a semiconductor device is manufactured through the following steps of: (1) forming a gate insulating film on a first conductivity-type layer of a semiconductor substrate, (2) forming on the gate insulating film, a gate electrode having slits each provided at at least one end on the drain electrode forming predetermined side, (3) selectively implanting a second conductivity-type impurity into the first conductivity-type layer with the gate electrode as a mask, (4) performing heat treatment thereby to activate the impurity and bringing regions of the impurity implanted into the slits and regions of the impurity implanted in the outside of the gate electrode, which are lying in the neighborhood of the slits into integral form, thereby forming a pair of second conductivity-type layers each of which overlaps with at least one side on the drain electrode forming predetermined side, of the gate electrode, and (5) forming within the pair of second conductivity-type layers, a pair of second conductivity-type high-concentration layers separated from the gate electrode and for contacting a source electrode and the drain electrode respectively.

In this semiconductor device fabrication process, the impurity implantation step is executed twice (step (3) and step (5)). The thermal diffusion step for thermally diffusing the impurity in a substrate plane direction is executed once (step (4)) to couple the two impurity diffusion regions placed in a separated state.

There has also been proposed a technique for fabricating a semiconductor device having a structure approximately similar to the semiconductor device shown in the patent document 1 in accordance with a completely separate process (refer to a patent document 2 (Japanese Patent Application Laid-open No. 2002-289845)).

In the present technique, a semiconductor device is manufactured through the following steps of: (1) implanting reverse conductivity-type ions into a surface layer of a semiconductor layer of one conductivity type in a low concentration thereby to selectively form a first offset region of a reverse conductivity type in a low concentration, (2) selectively simultaneously forming a gate electrode at the surface layer of the semiconductor layer outside lying on the first offset region through a gate oxide film interposed therebetween and a spacer layer with the same material as the gate electrode and apart from the gate electrode over the first offset region, (3) implanting reverse conductivity-type ions into the surface layer of the semiconductor layer through the gate electrode in a low concentration thereby to form a low-concentration and reverse conductivity-type second offset region aligned with an end of the gate electrode and brought into contact with the first offset region, (4) forming a coated insulating film so as to cover the surface of the semiconductor layer and performing anisotropic etching on the coated insulating film to leave part of the coated insulating film between the same and the spacer layer, thereby forming sidewall spacer films on sidewall portions of the spacer layer, and (5) implanting reverse conductivity-type ions through the sidewall spacer films in a high concentration thereby to form high-concentration and reverse conductivity-type source/drain regions aligned with the ends of the sidewall spacer films.

In this manufacture process, the step (2) corresponds to the slit forming step employed in the invention described in the patent document 1, and the step of implanting the impurity (ions) is executed three times (steps (1), (3) and (5)).

In the conventional manufacturing method, however, the step of implanting the impurity and the step of thermally diffusing the once-implanted impurity must be executed three times, and its manufacturing process has been complicated.

SUMMARY OF THE INVENTION

The present invention has been made in terms of the foregoing. It is therefore an object of the present invention to provide a semiconductor device manufacturing method wherein upon fabrication of a semiconductor device having a structure in which low-concentration diffusion layers with an impurity diffused therein in a low concentration overlap under a gate electrode and slits are provided in at least regions each located on the drain electrode side, of the gate electrode, the number of times that a step for implanting the impurity and a thermal diffusion step for coupling two impurity diffusion regions placed in a separated state are carried out can be made less than conventional.

According to one aspect of the present invention, for attaining the above object, there is provided a method for manufacturing a semiconductor device, comprising the steps of forming a gate insulating film over the surface of a semiconductor substrate, which is comprised of a first conductivity-type layer whose surface contains a first conductivity-type impurity; selectively implanting a second conductivity-type impurity into the first conductivity-type layer located on both sides adjacent to a predetermined region in which a conductive layer to be located over the semiconductor layer is formed, thereby forming a pair of low-concentration diffusion layers in which the second conductivity-type impurity is diffused in a low concentration; forming a conductive layer over the surface of the gate insulating film located so as to cover the surface of the first conductivity-type layer with no second conductivity-type impurity implanted therein and the surfaces of partial regions of the pair of low-concentration diffusion layers adjacent to the first conductivity-type layer; selectively implanting a second conductivity-type impurity into regions uncovered with at least the conductive layer, of the pair of low-concentration diffusion layers to contact source and drain electrodes, thereby forming a pair of high-concentration diffusion layers in which the second conductivity-type impurity is diffused in a high concentration; and forming slits so as to divide regions lying on the sides of the high-concentration diffusion layers into two respectively, each region being provided to contact at least the drain electrode of the conductive layer located over the low-concentration diffusion layers, wherein the semiconductor device is fabricated through at least the steps.

According to another aspect of the present invention, there is provided the method wherein the width and position of each of the slits formed in the conductive layer are determined according to an element breakdown voltage.

According to the present invention as described above, there can be provided a semiconductor device manufacturing method wherein upon fabrication of a semiconductor device having a structure in which low-concentration diffusion layers with an impurity diffused therein in a low concentration overlap under a gate electrode and slits are provided in at least regions each located on the drain electrode side, of the gate electrode, the number of times that a step for implanting the impurity and a thermal diffusion step for coupling two impurity diffusion regions placed in a separated state are carried out can be made less than conventional.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
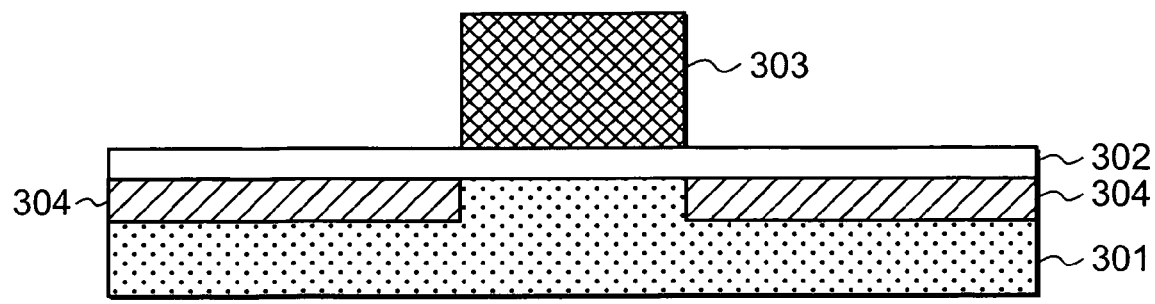
FIG. 1 is a schematic typical diagram showing one process step employed in a method for manufacturing a semiconductor device of the present invention.
Figure 2:
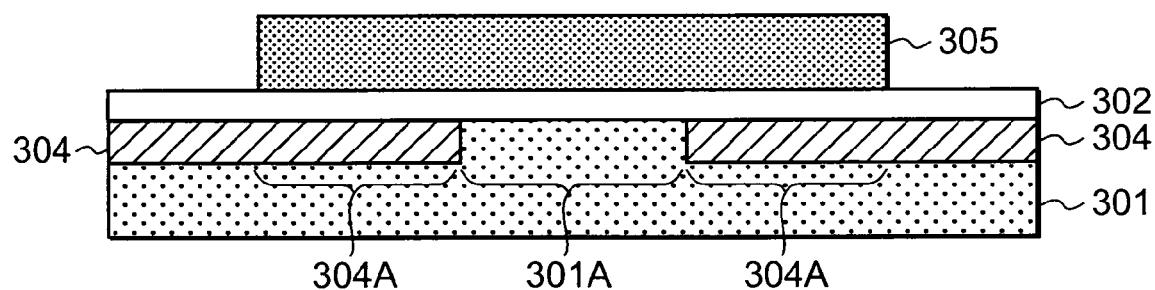
FIG. 2 is a schematic typical diagram illustrating another process step employed in the method for manufacturing the semiconductor device of the present invention.
Figure 3:
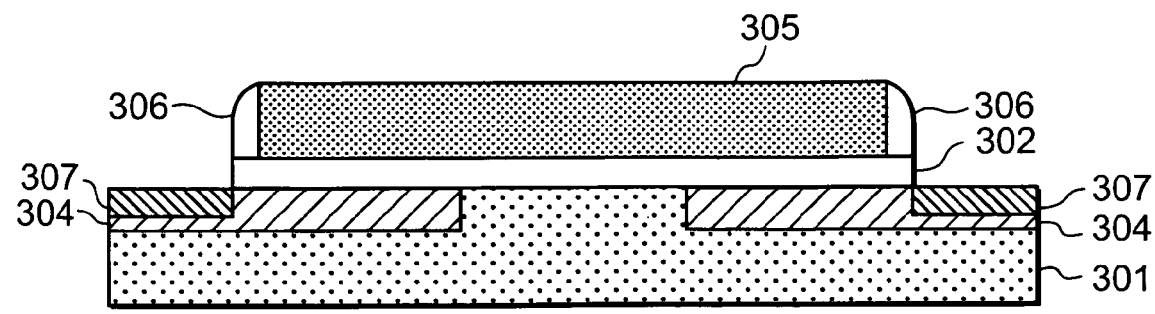
FIG. 3 is a schematic typical diagram depicting a further process step employed in the method for manufacturing the semiconductor device of the present invention.

A method for manufacturing a semiconductor device according to the present invention includes at least the steps of (1) forming a gate insulating film over the surface of a semiconductor substrate, which is comprised of a first conductivity-type layer (P-type semiconductor layer) whose surface contains a first conductivity-type impurity (hereinafter might be called "gate insulating film forming step"); (2) selectively implanting a second conductivity-type impurity into the first conductivity-type layer located on both sides adjacent to a predetermined region in which a conductive layer to be located over the semiconductor layer is formed, thereby forming a pair of low-concentration diffusion layers in which the second conductivity-type impurity is diffused in a low concentration (hereinafter might be called "first impurity implanting step"); (3) forming a conductive layer over the surface of the gate insulating film located so as to cover the surface of the first conductivity-type layer with no second conductivity-type impurity implanted therein and the surfaces of partial regions of the pair of low-concentration diffusion layers adjacent to the first conductivity-type layer (hereinafter might be called "conductive layer forming step"); (4) selectively implanting a second conductivity-type impurity into regions uncovered with at least the conductive layer, of the pair of low-concentration diffusion layers in order to contact source and drain electrodes, thereby forming a pair of high-concentration diffusion layers in which the second conductivity-type impurity is diffused in a high concentration (hereinafter might be called "second impurity implanting step"); and (5) forming slits so as to divide regions lying on the sides of the high-concentration diffusion layers into two respectively, each region being provided to contact at least the drain electrode of the conductive layer located over the low-concentration diffusion layers (hereinafter might be called "slit forming step").

Incidentally, after the slit forming step, the formation of contacts, the formation of wirings and the like can be implemented by the conventional known method. Of the conductive layers separated by the slit formation, the conductive layer located on the side opposite to the region on the side of the corresponding high-concentration diffusion layer provided to contact at least the drain electrode functions as a gate electrode.

Thus, a semiconductor device can be fabricated which has a structure high in element breakdown voltage and suitable even for its size reduction: a structure in which low-concentration diffusion layers with an impurity diffused therein in a low concentration overlap under a gate electrode and slits are provided in at least regions each located on the drain electrode side, of the gate electrode.

According to the semiconductor device manufacturing method of the present invention, the step of implanting the impurity may be performed twice upon fabrication of the above-type semiconductor device. A thermal diffusion step for coupling two impurity diffusion regions held in a separated state is also unnecessary. Therefore, the total number of times that the step for implanting the impurity and the thermal diffusion step for coupling the two impurity diffusion regions placed in the separated state are carried out can be reduced once in the present invention as compared with the related arts shown in the patent documents 1 and 2.

Incidentally, either one of "the first conductivity-type impurity" and "the second conductivity-type impurity" corresponds to an impurity (e.g., B) for forming a P-type semiconductor, and the other thereof corresponds to an impurity (e.g., P or As) for forming an N-type semiconductor.

"The low-concentration diffusion layers" means layers each of which contains an impurity in a concentration lying within a range from $1 \times 10^{+16}$ cm$^{-3}$ or more to $1 \times 10^{+19}$ cm$^{-3}$ or less. "The high-concentration diffusion layers" means layers each of which contains an impurity within a range from $1 \times 10^{+20}$ cm$^{-3}$ or more to $1 \times 10^{+21}$ cm$^{-3}$ or less.

In the semiconductor device manufacturing method of the present invention, for example, the step of forming sidewalls on their corresponding side surfaces of the conductive layer and their corresponding sidewall surfaces of slits formed by partitioning off the conductive layer, the step of forming silicide at the surface portions of the high-concentration diffusion layers and conductive layers, and the like can be carried out other than the five steps referred to above. Further, upon the formation of the high-concentration diffusion layers, the impurity is preferably implanted on a self-alignment basis with the conductive layer (conductive layer with the sidewalls where the sidewalls are formed) as a mask.

Upon implementation of the slit forming step, the width and position of each slit (in the direction (hereinafter might be abbreviated as "lateral direction") in which the drain and source electrodes disposed on the semiconductor substrate are arranged)) can suitably be selected depending on a desired element breakdown voltage.

A concrete preferred embodiment of a method for manufacturing a semiconductor device of the present invention will hereinafter be described in more detail using the accompanying drawings. FIGS. 1 through 5 are respectively diagrams showing one example of a method for manufacturing a semiconductor device of the present invention. In the figures, reference numeral 301 indicates a P-type semiconductor substrate, reference numeral 302 indicates a gate insulating film, reference numeral 303 indicates a resist film, reference numerals 304 indicate N-type low-concentration diffusion layers, reference numeral 305 indicates a conductive layer, reference numerals 306 indicate sidewalls, reference numerals 307 indicate N-type high-concentration diffusion layers, reference numerals 308 indicate slits, reference numerals 309 indicate sidewalls, and reference numeral 310 indicates a silicide layer, respectively.

Upon fabrication of the semiconductor device, the gate insulating film 302 is first formed on the surface of the P-type semiconductor substrate 301 using a vapor deposition method such as an oxidation treatment method, a CVD method or the like (gate insulating film forming process step).

Next, the resist film 303 is formed by patterning so as to cover the neighborhood of a predetermined region in which a gate electrode is to be formed, using the known photolithography method. Subsequently, an N-type impurity is implanted into a region uncovered with the resist film using the known ion-implantation technique. As the N-type impurity used in this case, for example, P is available and a dose amount can be selected from a range of $1\times10^{+12}$ cm$^{-2}$ to $1\times10^{+14}$ cm$^{-2}$. After the impurity implantation, the impurity is activated to form the N-type low-concentration diffusion layers 304 used as layers for relaxing electric fields for the source and drain of a MOS transistor (refer to FIG. 1).

After the removal of the resist film 303, a polysilicon film is next deposited on the surface of the gate insulating film 302 using the vapor deposition method such as the known CVD method or the like. Thereafter, the polysilicon film is patterned using the known photolithography method and etching method to form the conductive layer 305 (refer to FIG. 2).

Here, the conductive layer 305 is formed on the surface of the gate insulating film 302 positioned so as to cover the surface of a region 301A with no second conductivity-type impurity implanted therein, of the P-type semiconductor substrate 301 and the surfaces of partial regions 304A of the pair of N-type low-concentration diffusion layers 304 adjacent to the region 301A.

After the formation of the insulating film such as the oxide film using the vapor deposition method such as the known CVD method, sidewalls 306 are next formed on their corresponding sidewall portions of the conductive layer 305 using this insulating film through the known etching method. Further, the gate insulating film 302 lying in the areas or regions uncovered with the conductive layer 305 and the sidewalls 306 is removed to expose the N-type low-concentration diffusion layers 304.

Subsequently, a resist pattern is formed by the known photolithography technique. Afterwards, an N-type impurity is implanted into the surface-exposed N-type low-concentration diffusion layers 304 using the known ion-implantation technique to form the N-type high-concentration diffusion layers 307 aimed at contacting the source and drain electrodes of the MOS transistor (refer to FIG. 3). As the N-type impurity in this case, for example, As can be utilized and a dose amount can be selected from a range of $1\times10^{+15}$ cm$^{-2}$ to $1\times10^{+16}$ cm$^{-2}$.

Figure 4:
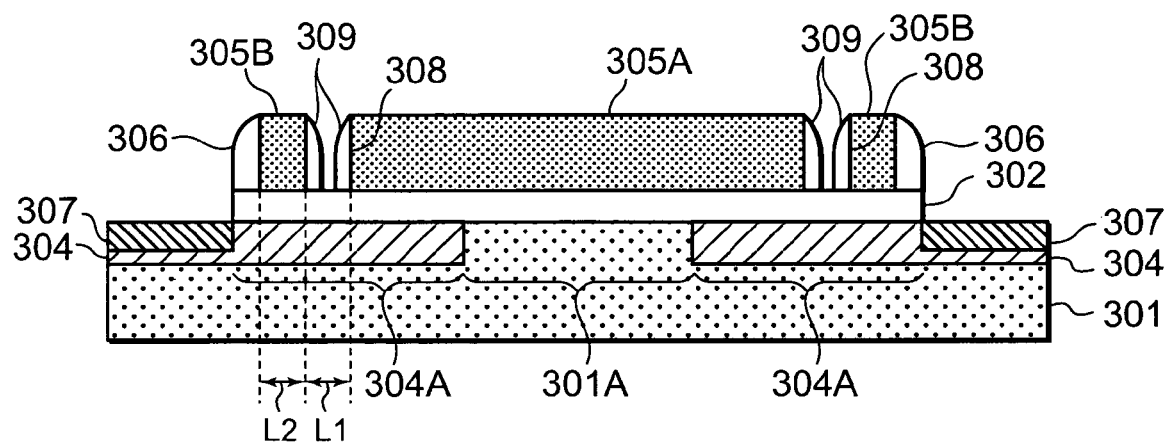
FIG. 4 is a schematic typical diagram showing a still further process step employed in the method for manufacturing the semiconductor device of the present invention.

Next, the polysilicon film that constitutes the conductive layer 305 is patterned by the known photolithography method and etching method to form the two slits 308 having depths that extend to the surface of the gate insulating film 302 in its thickness direction (refer to FIG. 4). Thus, the conductive layer 305 is divided into a conducive layer 305A (i.e., gate electrode) that is located between the two slits 308 and functions as the gate electrode and two conductive layers 305B that are located on the N-type high-concentration diffusion layer 307 sides of the slits 308 and do not function as the gate electrode. Incidentally, each of the conductive layers 305B can be utilized as an offset portion of an offset-type MOS transistor.

After the formation of the slits, an insulating film is formed by the vapor deposition method such as the known CVD method. Thereafter, sidewalls 309 are formed on both sidewall surfaces of the gate electrode 305A and sidewall surfaces on the slit sides, of the conductive layers 305B using the known etching method.

Incidentally, the slits 308 are provided over the regions 304A. Incidentally, although the two slits are provided in the embodiment illustrated in FIG. 4, only one slit may be provided. In this case, each of the slits 308 may be provided so as to divide the region located on the side of the high-concentration diffusion layer 307 (either one of the two regions indicated by reference numerals 307 shown in FIG. 4), which is provided to contact at least the drain electrode of the conductive layer 305 located above the N-type low-concentration diffusion layers 304, into two.

Here, the width (length L1 shown in FIG. 4) of the slit 308 may preferably range from 0.2 μm or more to 1.0 μm or less, more preferably from 0.4 μm or more to 0.5 μm or less. There is a case in which when the width L1 is 0.2 m or less, the slit widths are excessively narrow, thus encountering difficulties in forming the slits by the known photolithography method and etching method. There is also a case in which when the width L1 exceeds 1.0 μm, the distance between the conductive layer 305A that functions as the electrode and each of the N-type high-concentration diffusion layers 307 becomes excessively long thereby to increase the resistance, thus resulting in insufficient drive capacity of a high breakdown voltage MOS transistor.

The width (length L2 shown in FIG. 4) of each conductive layer 305B isolated by separation out of the gate electrode 305A located between the two slits 308 may preferably range from 0.2 μm or more to 1.0 μm or less, more preferably from 0.4 μm or more to 0.5 μm or less. There is a case in which when the width L2 is less than 0.2 μm, each line width is excessively narrow, so that it is difficult to form each slit by the known photolithography method and etching method. There is also a case in which when an alignment displacement occurs between the slit 308 and the gate electrode 305A upon the photolithography for forming each slit 308, part of the N-type high-concentration diffusion layer 307 is chipped away by etching, thus leading to a failure in breakdown voltage. Further, there is a case in which when the width L2 exceeds 1.0 μm, the distance between the conductive layer 305A that functions as the electrode and its corresponding N-type high-concentration diffusion layer 307 becomes excessively long thereby to increase the resistance, thus resulting in insufficient drive capacity of a high breakdown voltage MOS transistor.

Figure 5:
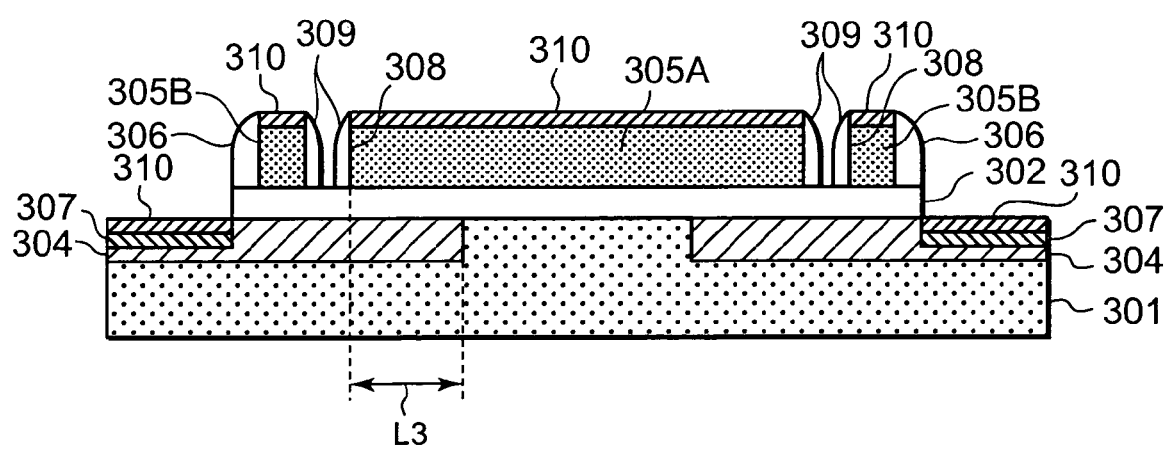
FIG. 5 is a schematic typical diagram illustrating a still further process step employed in the method for manufacturing the semiconductor device of the present invention.

Next, a metal film composed of a high melting-point metal such as molybdenum, cobalt or the like is deposited by the known vapor deposition method such as the sputtering method, followed by being subjected to heat treatment, thereby forming the silicide layer 310 only on the surfaces of the gate electrode 305A and conductive layers 305B comprised of silicon and the surfaces of the N-type high-concentration diffusion layers 307 on a self-alignment basis (refer to FIG. 5). Incidentally, the metal film deposited on the surfaces of the regions (sidewalls 306 and 309) in which silicide cannot be formed, is removed by the known etching method.

Thereafter, the semiconductor device can be obtained through the formation of contacts and the formation of wirings by the known process steps.

Incidentally, the length (length indicated by L3 in FIG. 5) at which the gate electrode 305A and the N-type low-concentration diffusion layer 304 overlap each other as viewed in the lateral direction, may preferably range from 0.3 µm or more to 1.5 µm or less, more preferably from 0.4 µm or more to 1.0 µm or less. There is a case in which when the overlap length L3 is less than 0.3 µm, hot carriers become easy to occur. There is also a case in which when the overlap length L3 exceeds 1.5 µm, the N-type low-concentration diffusion layers 304 become excessively long thereby to increase the resistance, thus resulting in insufficient drive capacity of the high breakdown voltage MOS transistor.

While the preferred form of the present invention has been described, it is to be understood that modifications will be apparent to those skilled in the art without departing from the spirit of the invention. The scope of the invention is to be determined solely by the following claims.

What is claimed is:

1. A method for manufacturing a semiconductor device, comprising:
    providing a semiconductor substrate of a first conductivity-type and having a major surface;
    forming a gate insulating layer on the major surface;
    defining a first area, in which a conductive pattern to be formed, on the major surface;
    forming a first impurity region of a second conductivity-type on the major surface and located on both sides adjacent to the first area and on a part of the first area, the first impurity region having a relatively low concentration;
    forming the conductive pattern on the gate insulating layer of the first area;
    forming a second impurity region of the second conductivity-type in both sides of the first impurity region in which the first impurity region is not covered with the conductive pattern, the second impurity region having a relatively high concentration; and
    forming a slit in the conductive pattern located over the first impurity region.

2. The method according to claim 1, wherein the slit is formed in one side of the conductive pattern 3. The method according to claim 2, wherein the slit is formed in the side in which a drain electrode is formed.

4. The method according to claim 1, further comprising another slit is formed in the other side of the conductive pattern.

5. The method according to claim 4, wherein one of the slits is formed in the side in which a drain electrode is formed and the other of the slits is formed in the side in which a source electrode is formed.

6. A method for manufacturing a semiconductor device, comprising:
    forming a gate insulating film over the surface of a semiconductor substrate, which is comprised of a first conductivity-type layer whose surface contains a first conductivity-type impurity;
    selectively implanting a second conductivity-type impurity into the first conductivity-type layer located on both sides adjacent to a predetermined region in which a conductive layer to be located over the semiconductor layer is formed, thereby forming a pair of low-concentration diffusion layers in which the second conductivity-type impurity is diffused in a low concentration;
    forming a conductive layer over the surface of the gate insulating film located so as to cover the surface of the first conductivity-type layer with no second conductivity-type impurity implanted therein and the surfaces of partial regions of the pair of low-concentration diffusion layers adjacent to the first conductivity-type layer;
    selectively implanting a second conductivity-type impurity into regions uncovered with at least the conductive layer, of the pair of low-concentration diffusion layers to contact source and drain electrodes, thereby forming a pair of high-concentration diffusion layers in which the second conductivity-type impurity is diffused in a high concentration; and
    forming slits so as to divide regions lying on the sides of the high-concentration diffusion layers into two respectively, each region being provided to contact at least the drain electrode of the conductive layer located over the low-concentration diffusion layers.

7. The method according to claim 6, wherein the width and position of each of the slits formed in the conductive layer are determined according to an element breakdown voltage.

* * * * *